(12) United States Patent
Jung et al.

(10) Patent No.: US 8,568,954 B2
(45) Date of Patent: Oct. 29, 2013

(54) POSITIVE PHOTOSENSITIVE RESIN COMPOSITION

(75) Inventors: Doo-Young Jung, Uiwang-si (KR);
Ji-Young Jeong, Uiwang-si (KR);
Hyun-Yong Cho, Uiwang-si (KR);
Yong-Sik Yoo, Uiwang-si (KR);
Kil-Sung Lee, Uiwang-si (KR);
Myoung-Hwan Cha, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 229 days.

(21) Appl. No.: 12/884,316

(22) Filed: Sep. 17, 2010

(65) Prior Publication Data

US 2011/0003248 A1 Jan. 6, 2011

Related U.S. Application Data

(63) Continuation-in-part of application No. PCT/KR2008/007906, filed on Dec. 31, 2008.

(30) Foreign Application Priority Data

Mar. 19, 2008 (KR) .................... 10-2008-0025458

(51) Int. Cl.
*G03F 7/023* (2006.01)
(52) U.S. Cl.
CPC ........... *G03F 7/0233* (2013.01); *Y10S 430/107* (2013.01)
USPC ........... 430/165; 430/191; 430/192; 430/193; 430/906
(58) Field of Classification Search
CPC .................................................. G03F 7/0233
USPC .............. 430/270.1, 906, 165, 191, 192, 193
See application file for complete search history.

(56) References Cited

U.S. PATENT DOCUMENTS

| 5,858,584 | A | 1/1999 | Okabe et al. | |
|---|---|---|---|---|
| 6,593,043 | B2 | 7/2003 | Suwa et al. | |
| 6,927,012 | B2 * | 8/2005 | Hatanaka et al. | 430/270.1 |
| 6,929,890 | B2 * | 8/2005 | Miyoshi et al. | 430/7 |
| 7,687,208 | B2 | 3/2010 | Shibui | |
| 8,080,350 | B2 | 12/2011 | Banba et al. | |
| 8,088,882 | B2 * | 1/2012 | Sakayori | 528/310 |
| 2002/0090564 | A1 | 7/2002 | Suwa et al. | |
| 2004/0197703 | A1 * | 10/2004 | Miyoshi et al. | 430/270.1 |

FOREIGN PATENT DOCUMENTS

| JP | 63-096162 A | 4/1988 |
|---|---|---|
| JP | 07-281441 A | 10/1995 |
| JP | 09-302221 | 11/1997 |
| JP | 10-307393 | 11/1998 |
| JP | 11-338157 | 12/1999 |
| JP | 2000-292913 | 10/2000 |
| JP | 2006-349700 | 12/2006 |
| JP | 2007-079264 | 3/2007 |
| KR | 10-2002-0041302 A | 6/2002 |
| KR | 10-2003-0053471 A | 6/2003 |
| TW | 200504464 | 2/2005 |
| WO | 2007/063721 A1 | 6/2007 |
| WO | 2008/020573 A1 | 2/2008 |
| WO | 2009/116724 A1 | 9/2009 |

OTHER PUBLICATIONS

International Search Report in counterpart International Application No. PCT/KR2008/007906, dated Aug. 10, 2009.
International Written Opinion in counterpart International Application No. PCT/KR2008/007906, dated Aug. 10, 2009.

* cited by examiner

*Primary Examiner* — John Chu
(74) *Attorney, Agent, or Firm* — Additon, Higgins, Pendleton & Ashe, P.A.

(57) ABSTRACT

A positive photosensitive resin composition according to one embodiment of the present invention includes a polyamic acid or a polyamic acid ester compound including a repeating unit represented by Formula 1 defined in this specification, a photosensitive diazoquinone compound, a silane compound, a phenol compound, and a solvent. The positive photosensitive resin composition can be cured at a low temperature of 260° C. or less, and can have high sensitivity, resolution, residue removal, substrate adherence, and pattern-forming capabilities, and low film shrinkage.

10 Claims, No Drawings

POSITIVE PHOTOSENSITIVE RESIN COMPOSITION

CROSS-REFERENCE TO RELATED APPLICATIONS

This application is a continuation-in-part of International Application No. PCT/KR2008/007906, filed Dec. 31, 2008, pending, which designates the U.S., published as WO 2009/116724, and is incorporated herein by reference in its entirety, and claims priority therefrom under 35 USC Section 120. This application also claims priority under 35 USC Section 119 from Korean Patent Application No. 10-2008-0025458, filed Mar. 19, 2008, in the Korean Intellectual Property Office, the entire disclosure of which is also incorporated herein by reference.

FIELD OF THE INVENTION

The present invention relates to a positive photosensitive resin composition.

BACKGROUND OF THE INVENTION

Conventional surface protective layers and interlayer insulating layers for semiconductor devices can include a polyimide resin, which can have excellent heat resistance and electrical characteristics, mechanical characteristics, and the like.

Polyimide resins have recently been used in the form of a photosensitive polyimide precursor composition to form a surface protective layer, an interlayer insulating layer, and the like. The photosensitive polyimide precursor composition can be coated on a semiconductor device, patterned by ultraviolet (UV) rays, developed, and heat imidized. In this manner, it is possible to significantly shorten a process for making a surface protective layer, an interlayer insulating layer, and the like, compared to processes that use conventional non-photosensitive polyimide precursor compositions.

Photosensitive polyimide precursor compositions can be a positive type, in which an exposed part is dissolved by development, or a negative type, in which the exposed part is cured and maintained. A positive type composition can be useful in many applications because it can be developed by a non-toxic alkali aqueous solution. Positive photosensitive polyimide precursor compositions can include a polyimide precursor of polyamic acid, a photosensitive material of diazonaphtoquinone, and the like. However, the positive photosensitive polyimide precursor composition may not provide a desired pattern because the carbonic acid of the polyamidic acid used can be too highly soluble in an alkali.

Japanese Patent Laid-Open Publication No. H10-307393 is directed to a material including a phenolic hydroxyl acid group instead of a carbonic acid which is introduced by esterificating polyamidic acid with an alcohol compound having at least one hydroxyl group. This material, however, may be insufficiently developed, which can cause problems such as reduced layer thickness (layer loss) or resin delamination from the substrate.

Recently, a material in which a polybenzoxazole precursor is mixed with a diazonaphtoquinone compound has drawn attention (Japanese Patent Laid-open Publication No. S63-96162). When the polybenzoxazole precursor composition is actually used, however, an unexposed part can exhibit significant layer loss, so it can be difficult to obtain a desirable pattern after the developing process. Increasing the molecular weight of the polybenzoxazole precursor may reduce layer loss of the unexposed part but can generate development residue (scum), which can deteriorate resolution and increase development times on the exposed part.

In order to solve this problem, it has been reported that layer loss can be suppressed by adding a certain phenol compound to a polybenzoxazole precursor composition (Japanese Patent Laid-Open Publication No. H9-302221 and Japanese Patent Laid-Open Publication No. 2000-292913). However, the effect of suppressing layer loss of the unexposed part may be insufficient. Accordingly, there is still a need to improve layer loss suppression and to prevent development residue (scum) generation.

After forming the pattern, the conventional photosensitive polyimide or polybenzoxazole is cured at a temperature of around 350° C. Magnetoresistive RAM (MRAM) that is usable for the next generation memory device is weak at a high temperature, so devices for the same require a low curing process temperature. Accordingly, such devices need a material that can be used as a surface protective layer and an interlayer insulating layer and that can be cured at a low temperature of 260° C. or below.

By using a latent thermal acid generator or a monomer having excellent flexibility, it has been reported that it is possible to use low curing temperatures by using a polymerized polybenzoxazole precursor (Japanese Patent Laid-Open Publication No. 2006-349700 and Japanese Patent Laid-Open Publication No. 2007-079264). However, the obtained polybenzoxazole precursor has poor adherence to the substrate. Accordingly, there is still a need to improve the various characteristics of a layer including the same.

SUMMARY OF THE INVENTION

One exemplary embodiment of the present invention provides a photosensitive resin composition that can be cured at a low temperature of 260° C. or less and can have high sensitivity, resolution, residue removal, substrate adherence, and pattern-forming capabilities, and low film shrinkage and excellent film properties after curing.

Another embodiment of the present invention provides a photosensitive resin film made using the positive photosensitive resin composition.

A further embodiment of the present invention provides a semiconductor electronic component that is produced using the positive photosensitive resin composition.

The embodiments of the present invention are not limited to the above technical purposes, and a person of ordinary skill in the art can understand other technical purposes.

According to one embodiment of the present invention, provided is a positive photosensitive resin composition that includes (A) a polyamic acid or polyamic acid ester compound including a repeating unit represented by the following Formula 1, (B) a photosensitive diazoquinone compound, (C) a silane compound, (D) a phenol compound, and (E) a solvent:

[Chemical Formula 1]

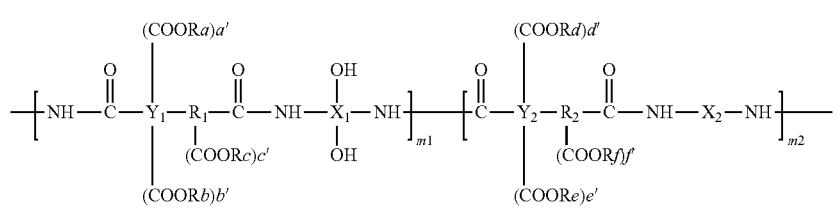

wherein, in the above Formula 1, $R_a$, $R_b$, $R_c$, $R_d$, $R_e$, and $R_f$ are the same or different and are independently hydrogen or a monovalent organic group, $R_1$ and $R_2$ are the same or different and are independently a single bond or substituted or unsubstituted alkylene, a', b', c', d', e', and f' are the same or different and are independently 0 or 1, and a'+b'+c' and d'+e'+f' are integers of 2 or 3, respectively, $Y_1$ and $Y_2$ are the same or different and are independently a substituted or unsubstituted aliphatic or alicyclic organic group, $X_1$ is substituted or unsubstituted arylene, substituted or unsubstituted alkylene, or substituted or unsubstituted cycloalkylene, $X_2$ is a divalent to quadrivalent aromatic or aliphatic organic group or a functional group represented by the following Formula 2, $m_1$ and $m_2$ are mole ratios, $m_1+m_2=100$ mol %, $m_1$ ranges from 60 to 100 mol %, and $m_2$ ranges from 0 to 40 mol %,

[Chemical Formula 2]

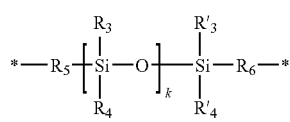

wherein in the above Formula 2, $R_3$, $R_4$, $R'_3$ and $R'_4$ are the same or different and are independently substituted or unsubstituted alkyl, substituted or unsubstituted aryl, substituted or unsubstituted alkoxy, or hydroxy, $R_5$ and $R_6$ are the same or different and are independently substituted or unsubstituted alkylene or substituted or unsubstituted arylene, and k is an integer ranging from 1 to 50.

According to another embodiment of the present invention, provided is a photosensitive resin film made using the positive photosensitive resin composition.

According to a further embodiment of the present invention, provided is a semiconductor electronic component made using the positive photosensitive resin composition.

Hereinafter, embodiments of the present invention will be described in detail.

The positive photosensitive resin composition can be cured at a low temperature of 260° C. or less, and can have high sensitivity, resolution, residue removal, substrate adherence, and pattern-forming capabilities, and low film shrinkage.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The photosensitive resin composition according to one embodiment of the present invention includes (A) a polyamic acid or polyamic acid ester compound including a repeating unit represented by the following Formula 1, (B) a photosensitive diazoquinone compound, (C) a silane compound, (D) a phenol compound, and (E) a solvent.

As used herein, when a specific definition is not otherwise provided, the term "substituted" refers to one substituted with at least one or more substituents including halogen, alkyl, aryl, alkoxy, amino, alkenyl, and combinations thereof.

As used herein, when a specific definition is not otherwise provided, the term "alkyl" refers to C1 to C30 alkyl, for example C1 to C15 alkyl, the term "cycloalkylene" refers to C3 to C30 cycloalkylene, for example C3 to C18 cycloalkylene, the term "alkoxy" refers to C1 to C30 alkoxy, for example C1 to C18 alkoxy, the term "aryl" refers to C6 to C30 aryl, for example C6 to C18 aryl, the term "alkenyl" refers to C2 to C30 alkenyl, for example C2 to C18 alkenyl, the term "alkylene" refers to C1 to C30 alkylene, for example C1 to C18 alkylene, and the term "arylene" refers to C6 to C30 arylene, for example C6 to C18 arylene.

As used herein, when a specific definition is not otherwise provided, the term "organic group" refers to an aliphatic organic group, alicyclic organic group, or aromatic organic group.

As used herein, when a specific definition is not otherwise provided, the term "divalent to quadrivalent organic group" refers to an organic group including 2 to 4 bonds.

As used herein, the term "aliphatic organic group" refers to C1 to C30 alkyl, C2 to C30 alkenyl, or C2 to C30 alkynyl, the term "alicyclic organic group" refers to C3 to C30 cycloalkyl, C3 to C30 cycloalkenyl, or C3 to C30 cycloalkynyl, and the term "aromatic organic group" refers to C6 to C30 aryl or C2 to C30 heteroaryl.

Also as used herein, when a specific definition is not otherwise provided, the term "hetero" refers to a group including 1 to 20, for example 1 to 15, and as another example 1 to 5, heteroatoms comprising one or more of N, O, S, P, Si, and combinations thereof.

Exemplary components included in photosensitive resin compositions according to embodiments of the present invention will hereinafter be described in detail.

(A) Polyamic Acid or Polyamic Acid Ester Compound

The polyamic acid or polyamic acid ester compound includes a repeating unit represented by the following Formula 1.

[Chemical Formula 1]

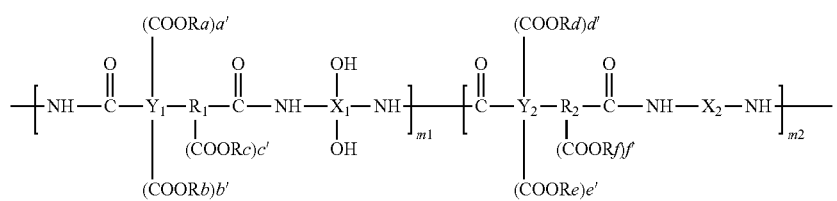

In the above Formula 1, $R_a$, $R_b$, $R_c$, $R_d$, $R_e$, and $R_f$ are the same or different and are independently hydrogen or a monovalent organic group, and for example, alkyl, $R_1$ and $R_2$ are the same or different and are independently a single bond or substituted or unsubstituted alkylene, and in one embodiment, C1 to C5 alkylene, and in another embodiment, C2 to C3 alkylene, a', b', c', d', e', and f' are the same or different and are independently 0 or 1, and a'+b'+c' and d'+e'+f' are integers of 2 or 3, respectively, $m_1$ and $m_2$ are mole ratios, $m_1+m_2=100$ mol %, $m_1$ ranges from 60 to 100 mol %, and $m_2$ ranges from 0 to 40 mol %, $X_1$ is substituted or unsubstituted arylene, substituted or unsubstituted alkylene, or substituted or unsubstituted cycloalkylene, and $X_2$ is a divalent to quadrivalent aromatic or aliphatic organic group or a functional group represented by the following Formula 2.

In one embodiment, $X_1$ is derived from a dihydroxy-included diamine compound. Exemplary dihydroxy-included diamine compounds include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, cyclohexyldiamine, methylenebiscyclohexylamine, and the like, and combinations thereof.

For example, $X_1$ may be a compound represented by the following Formula 3 or 4.

[Chemical Formula 3]

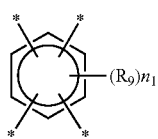

[Chemical Formula 4]

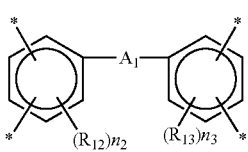

In the above Formulae 3 and 4, $A_1$ includes O, CO, $CR_{10}R_{11}$, $SO_2$, S, or CONH, $R_9$ to $R_{13}$ are the same or different and are independently hydrogen, substituted or unsubstituted aryl, or substituted or unsubstituted alkyl, for example, $R_{10}$ and $R_{11}$ are fluoroalkyls, $n_1$ is an integer of 1 or 2, and $n_2$ and $n_3$ are the same or different and are independently integers from 1 to 3.

$X_2$ is a divalent to quadrivalent aromatic or aliphatic organic group, or a functional group represented by the following Formula 2.

[Chemical Formula 2]

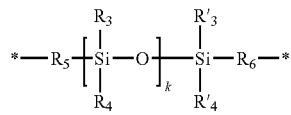

In the above Formula 2, $R_3$, $R_4$, $R'_3$ and $R'_4$ are the same or different and are independently substituted or unsubstituted alkyl, substituted or unsubstituted aryl, substituted or unsubstituted alkoxy, or hydroxy, $R_5$ and $R_6$ are the same or different and are independently divalent substituted or unsubstituted alkylene or substituted or unsubstituted arylene, and k is an integer ranging from 1 to 50.

$X_2$ can be, for example, derived from a diamine monomer such as but not limited to an aromatic amine, an alicyclic diamine, an aliphatic diamine, or a silicon diamine.

Examples of the diamine monomers include without limitation 3,4'-diaminodiphenylether, 4,4'-diaminodiphenylether, 3,4'-diaminodiphenyl methane, 4,4'-diaminodiphenyl methane, 3,4'-diaminodiphenyl sulfone, 4,4'-diaminodiphenyl sulfone, 3,4'-diaminodiphenyl sulfide, 4,4'-diaminodiphenyl sulfide, para-phenylenediamine, meta-phenylenediamine, 1,5-naphthalenediamine, 2,6-naphthalenediamine, cyclohexyldiamine methylenebiscyclohexylamine, 3,3'-diamino-4,4'-dihydroxybiphenyl, 3,3'-diamino-4,4'-dihydroxysulfone, 4,4'-diamino-3,3'-dihydroxyphenylsulfone, bis(3-amino-4-hydroxyphenyl)methane, 2,2-bis(3-2,2-bis(3-amino-4-hydroxyphenyl)hexafluoropropane, 4,4'-diamino-3,3'-dihydroxybenzophenone, 3,3'-diamino-4,4'-dihydroxybenzophenone, 4,4'-diamino-3,3'-dihydroxydiphenylether 1,4-diamino-2,5-dihydroxybenzene, 1,3-diamino-2,4-dihydroxybenzene, and the like, and mixtures thereof. These diamine monomers can be used singularly or in combination.

Examples of the silicon diamine include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

$Y_1$ and $Y_2$ can be the same or different and are independently substituted or unsubstituted aliphatic or alicyclic organic group. The aliphatic or alicyclic organic group may include an aryl, alkenyl, or alkyl substituent, and these substituents may be linked to each other to form a fused ring with an alicyclic cycle.

For example, $Y_1$ and $Y_2$ can be derived from tetracarbonic acid dianhydride, or a derivative thereof that reacts with a diamine derivative to produce polyamic acid, or reacts with a diamino phenol derivative to form a polyamic acid ester. $Y_1$ and $Y_2$ are quadrivalent alicyclic organic groups including 4 to 40 carbon atoms.

For example, $Y_1$ and $Y_2$ can be derived from one of the compounds the following Formulae 5 to 8.

[Chemical Formula 5]

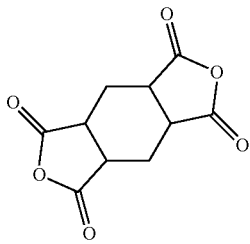

[Chemical Formula 6]

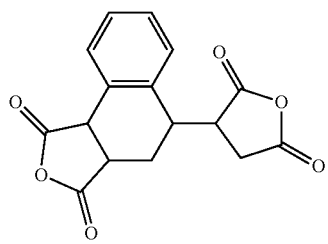

[Chemical Formula 7]

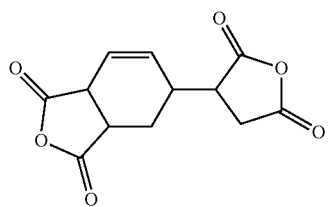

[Chemical Formula 8]

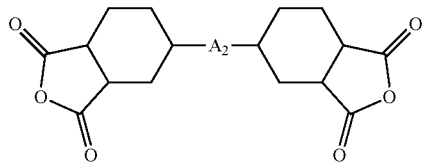

In the above Formula 8, $A_2$ includes O, $CR_{14}R_{15}$, CO, CONH, S, or $SO_2$, where $R_{14}$ and $R_{15}$ are the same or different and are independently substituted or unsubstituted alkyl, hydrogen, or fluoroalkyl.

The polyamic acid or polyamic acid ester compound may have a weight average molecular weight (Mw) of 3000 to 300,000. When the weight average molecular weight is less than 3000, sufficient properties may not be obtained, whereas when the weight average molecular weight is more than 300,000, solubility with respect to an organic solvent may be reduced and thus it can be difficult to handle.

(B) Photosensitive Diazoquinone Compound

The photosensitive diazoquinone compound may be a compound including a 1,2-benzoquinone diazide or 1,2-naphtoquinone diazide structure. These compounds are described in U.S. Pat. Nos. 2,797,213 and 3,669,658, the entire disclosure of each of which is incorporated herein by reference.

The photosensitive diazoquinone compound may include a compound represented by the following Formulae 9 to 12, and combinations thereof, but is not limited thereto.

[Chemical Formula 9]

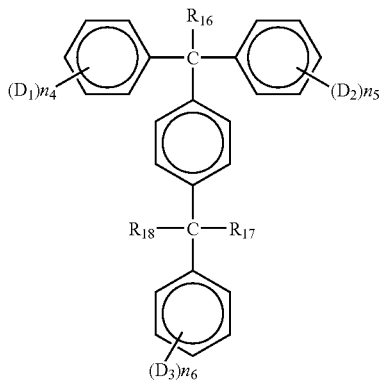

In the above Formula 9, $R_{16}$ to $R_{18}$ are the same or different and are independently substituted or unsubstituted alkyl, for example, $CH_3$, $D_1$ to $D_3$ are the same or different and are independently OQ, Q is hydrogen or the following Formula 9-1 or 9-2, provided that all Q are not hydrogen, and $n_4$ to $n_6$ are the same or different and are independently integers ranging from 1 to 3.

[Chemical Formula 9-1]

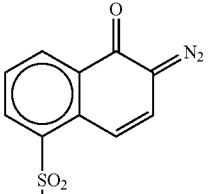

[Chemical Formula 9-2]

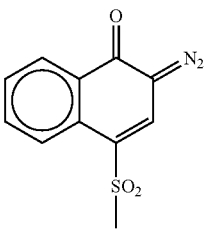

[Chemical Formula 10]

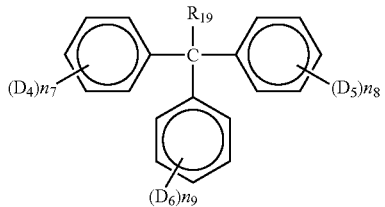

In the above Formula 10, $R_{19}$ is hydrogen or substituted or unsubstituted alkyl, $D_4$ to $D_6$ are the same or different and are OQ, wherein Q is the same as defined in Chemical Formula 9, and $n_7$ to $n_9$ are the same or different and independently are integers ranging from 1 to 3.

[Chemical Formula 11]

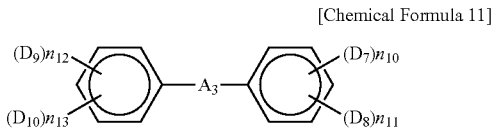

In the above Formula 11, $A_3$ is CO or CRR', R and R' are the same or different and are independently substituted or unsubstituted alkyl, $D_7$ to $D_{10}$ are the same or different and are independently hydrogen, substituted or unsubstituted alkyl, OQ, or NHQ, Q is the same as defined in Chemical Formula 9, $n_{10}$, $n_{11}$, $n_{12}$, and $n_{13}$ are the same or different and are independently integers ranging from 1 to 4, and $n_{10}+n_{11}$ and $n_{12}+n_{13}$ are the same or different and are independently integers of 5 or less, provided that at least one of $D_7$ to $D_8$ is OQ, and one aromatic ring includes one to three OQs and the other aromatic ring includes one to four OQs.

[Chemical Formula 12]

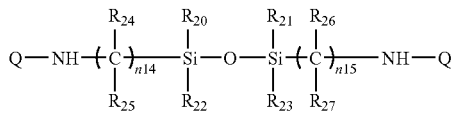

In the above Formula 12, $R_{20}$ to $R_{27}$ are the same or different and are independently hydrogen or substituted or unsubstituted alkyl, $n_{14}$ and $n_{15}$ are the same or different and are independently integers ranging from 1 to 5, for example 2 to 4, and Q is the same as defined in Chemical Formula 9.

The photosensitive resin composition includes 5 to 100 parts by weight of the photosensitive diazoquinone compound, based on 100 parts by weight of the polyamic acid or the polyamic acid ester compound having the above Formula 1. In some embodiments, the photosensitive diazoquinone compound resin may be included in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight, based on 100 parts by weight of the polyamic acid or the polyamic acid ester compound having the above Formula 1. Further, according to some embodiments of the present invention, the amount of the photosensitive diazoquinone compound can be in a range from any of the foregoing amounts to any other of the foregoing amounts. Within the above range, residues may not remain after exposure and there may not be film thickness loss during development, which can result in good pattern formation.

(C) Silane Compound

The silane compound can improve adherence between the photosensitive resin composition and a substrate. The silane compound may be represented by the following Formula 13.

[Chemical Formula 13]

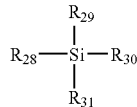

In the above Formula 13, $R_{28}$ is vinyl, substituted or unsubstituted alkyl, or substituted or unsubstituted aryl, for example, 3-(meth)acryloxypropyl, p-styryl, or 3-(phenylamino)propyl, and $R_{29}$ to $R_{31}$ are the same or different and are independently substituted or unsubstituted alkoxy, substituted or unsubstituted alkyl, or halogen, provided that at least one of $R_{29}$ to $R_{31}$ is alkoxy or a halogen. The alkoxy may be C1 to C8 alkoxy, and the alkyl may be C1 to C20 alkyl.

Examples of the silane compound include without limitation compounds represented by the following Formulae 14 to 15; vinyltrimethoxysilane, vinyltriethoxysilane, vinyl trichlorosilane, vinyltris(β-methoxyethoxy)silane; 3-methacryloxypropyltrimethoxysilane, 3-acryloxypropyltrimethoxysilane, p-styryl 3-methacryloxypropylmethyldimethoxysilane, 3-methacryloxypropyl methyl diethoxysilane, trimethoxy[3-(phenylamino)propyl]silane; and the like, and combinations thereof. In one embodiment, vinyltrimethoxysilane or vinyltriethoxysilane may be appropriate.

[Chemical Formula 14]

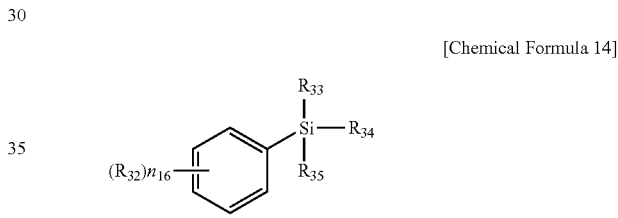

In the above Formula 14, $R_{32}$ is $NH_2$ or $CH_3CONH$, $R_{33}$ to $R_{35}$ are the same or different and are independently substituted or unsubstituted alkoxy, for example, the alkoxy may be $OCH_3$ or $OCH_2CH_3$, and $n_{16}$ is an integer ranging from 1 to 5.

[Chemical Formula 15]

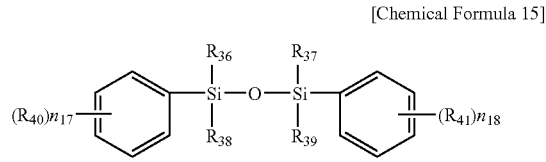

In the above Formula 15, $R_{36}$ to $R_{39}$ are the same or different and are independently substituted or unsubstituted alkoxy such as $OCH_3$, $R_{40}$ and $R_{41}$ are the same or different and are independently substituted or unsubstituted amino such as $NH_2$ or $CH_3CONH$, and $n_{17}$ and $n_{18}$ are the same or different and are independently integers ranging from 1 to 5.

The photosensitive resin composition includes 0.1 to 30 parts by weight of the silane compound, based on 100 parts by weight of the polyamic acid or the polyamic acid ester compound having the above Formula 1. In some embodiments, the silane compound may be included in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight, based on 100 parts by weight of the polyamic acid or the polyamic acid ester compound having the above Formula 1. Further, according to some embodiments of the present invention, the amount of the silane compound can be in a range from any of the foregoing amounts to any other of the foregoing amounts. When the amount of the silane compound is less than 0.1 parts by weight, adherence between lower and upper layers may not be sufficient, whereas when the amount of the silane compound is more than 30 parts by weight, residue film may remain after development, and photo characteristics (transmittance), and mechanical properties such as tensile strength, elongation, Young's modulus, and so on may be reduced.

(D) Phenol Compound

The phenol compound can increase dissolution and sensitivity of exposed parts during development using an alkali aqueous solution, and can play a role of forming high resolution patterns without residues (scum).

The phenol compound may be represented by the following Formulae 16 to 21, and combinations thereof, but is not limited thereto.

[Chemical Formula 16]

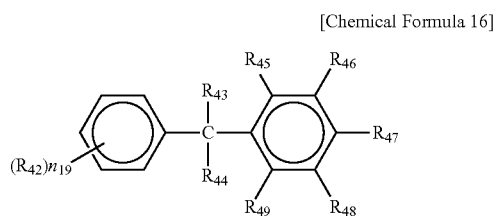

In the above Formula 16, $R_{42}$ to $R_{44}$ are the same or different and are independently hydrogen or substituted or unsubstituted alkyl, $R_{45}$ to $R_{49}$ are the same or different and are independently hydrogen, OH, or substituted or unsubstituted alkyl such as $CH_3$, and $n_{19}$ is an integer ranging from 1 to 5.

[Chemical Formula 17]

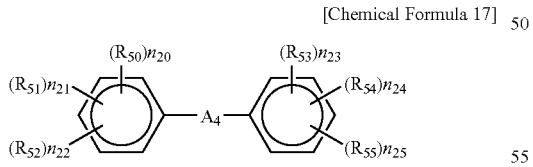

In the above Formula 17, $R_{50}$ to $R_{55}$ are the same or different and are independently hydrogen, OH, or substituted or unsubstituted alkyl, $A_4$ is $CR_{56}R_{57}$ or a single bond, where $R_{56}$ and $R_{57}$ are the same or different and are independently hydrogen or substituted or unsubstituted alkyl such as $CH_3$, and $n_{20}+n_{21}+n_{22}$ and $n_{23}+n_{24}+n_{25}$ are the same or different and are independently integers of 5 or less.

[Chemical Formula 18]

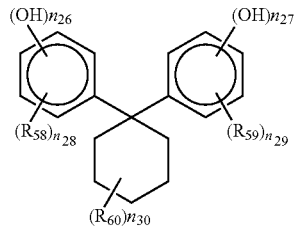

In the above Formula 18, $R_{58}$ to $R_{60}$ are the same or different and are independently hydrogen or substituted or unsubstituted alkyl, $n_{26}$, $n_{27}$, and $n_{30}$ are the same or different and are independently integers ranging from 1 to 5, and $n_{28}$ and $n_{29}$ are the same or different and are independently integers ranging from 1 to 4.

[Chemical Formula 19]

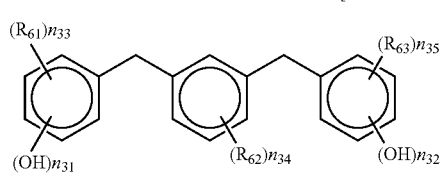

In the above Formula 19, $R_{61}$ to $R_{63}$ are the same or different and are independently hydrogen, OH, or substituted or unsubstituted alkyl, and $n_{31}$ to $n_{35}$ are the same or different and are independently integers ranging from 1 to 4, provided that $n_{33}+n_{31}$ and $n_{32}+n_{35}$ are independently integers of 5 or less.

[Chemical Formula 20]

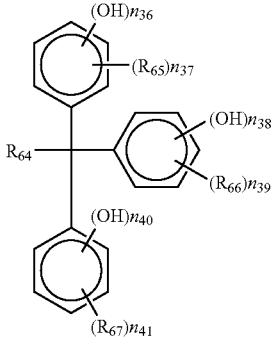

In the above Formula 20, $R_{64}$ is substituted or unsubstituted alkyl such as $CH_3$, $R_{65}$ to $R_{67}$ are the same or different and are independently hydrogen or substituted or unsubstituted alkyl, $n_{36}$, $n_{38}$, and $n_{40}$ are the same or different and are independently integers ranging from 1 to 5, and $n_{37}$, $n_{39}$, and $n_{41}$ are the same or different and are independently integers ranging from 1 to 4, provided that $n_{36}+n_{37}$, $n_{38}+n_{39}$, and $n_{40}+n_{41}$ are independently integers of 5 or less.

[Chemical Formula 21]

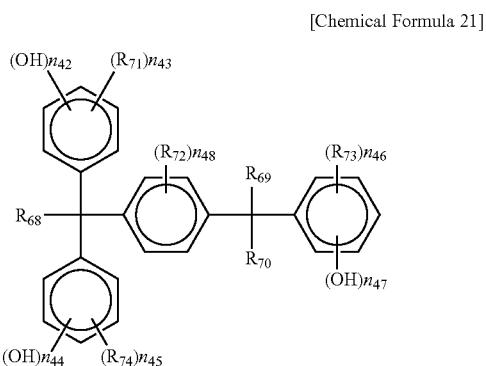

In the above Formula 21, $R_{68}$, $R_{69}$, and $R_{70}$ are the same or different and are independently substituted or unsubstituted alkyl such as $CH_3$, $R_{71}$ to $R_{74}$ are the same or different and are independently hydrogen or substituted or unsubstituted alkyl, $n_{42}$, $n_{44}$, and $n_{47}$ are the same or different and independently are integers ranging from 1 to 5, $n_{43}$, $n_{45}$, and $n_{46}$ are the same or different and are independently integers ranging from 1 to 4, and $n_{48}$ is an integer ranging from 1 to 5, provided that $n_{42}+n_{43}$, $n_{44}+n_{45}$, and $n_{46}+n_{47}$ are independently integers of 5 or less.

The photosensitive resin composition includes 1 to 30 parts by weight of the phenol compound, based on 100 parts by weight of the polyamic acid or the polyamic acid ester compound having the above Formula 1. In some embodiments, the phenol compound may be included in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight, based on 100 parts by weight of the polyamic acid or the polyamic acid ester compound having the above Formula 1. Further, according to some embodiments of the present invention, the amount of the phenol compound can be in a range from any of the foregoing amounts to any other of the foregoing amounts. When the amount of the phenol compound is less than 1 part by weight, residues (scum) may remain during development to obtain a poor pattern profile. When the amount of the phenol compound is more than 30 parts by weight, development rate of a non-exposed part can increase to obtain a distinct pattern and mechanical properties of a film after thermal curing may be remarkably deteriorated.

(E) Solvent

Exemplary solvents may include without limitation N-methyl-2-pyrrolidone, γ-butyrolactone, N,N-dimethyl acetamide, dimethylsulfoxide, diethyleneglycol dimethylether, diethyleneglycol diethylether, diethyleneglycol dibutylether, propyleneglycol monomethylether, dipropyleneglycol monomethylether, propyleneglycol monomethylether acetate, methyl lactate, ethyl lactate, butyl lactate, methyl-1,3-butyleneglycol acetate, 1,3-butyleneglycol-3-monomethylether, methyl pyruvate, ethyl pyruvate, methyl-3-methoxy propionate, and the like. The solvent may be used singularly or in combination.

The solvent is included in an amount of 50 to 200 parts by weight, based on 100 parts by weight of the polyamic acid or the polyamic acid ester compound of the above Formula 1.

Within this range, a sufficiently thick film can be obtained and good solubility and coating can be provided.

(F) Other Additives

The photosensitive resin composition may include one or more additive(s) (F) in addition to the (A) to (D) components.

The other additives may include a latent thermal acid generator. Exemplary latent thermal acid generators include without limitation arylsulfonic acids such as p-toluene sulfonic acid or benzene sulfonic acid; perfluoroalkyl sulfonic acids such as trifluoromethanesulfonic acid or fluorobutane sulfonic acid; alkane sulfonic acids, such as methane sulfonic acid, ethane sulfonic acid, or butane sulfonic acid; and the like, and mixtures thereof.

The latent thermal acid generator can promote dehydration reactions of the hydroxyl group-contained polyamide structure of the polybenzoxazole precursor and cyclization, and it can prevent the phenomenon of decreasing the cyclization degree even if the curing temperature is decreased.

Other exemplary additives include a suitable surfactant or leveling agent to prevent staining of the film or to improve development.

The process for forming a pattern using a positive photosensitive resin composition can include: coating a positive photosensitive resin composition on a supporting substrate; drying the coated composition to provide a photosensitive polyamic acid or polyamic acid ester compound layer; exposing the polyamic acid or polyamic acid ester compound layer; developing the exposed polyamic acid or polyamic acid ester compound layer in an alkali aqueous solution to provide a photosensitive resin film; and heating the photosensitive resin film. The conditions of processes for coating, exposing, and developing a photosensitive resin composition to provide a pattern are widely known in this art, so detailed descriptions thereof will be omitted in this specification. The photosensitive resin film may be heated at a low temperature of 260° C. or below. The polyamic acid and polyamic acid ester compound present in the photosensitive resin film are respectively transformed to a polyimide and polybenzoxazole by dehydrogenation.

According to another embodiment of the present invention, provided is a photosensitive resin film such as insulation layer or protective layer prepared by a positive photosensitive resin compound. In addition, according to a further embodiment of the present invention, provided is a semiconductor member prepared by the photosensitive resin composition according to the present invention. The photosensitive resin composition according to the present invention can be used as an insulation layer, a passivation layer, or a buffer coating layer in a semiconductor member, or a surface protective layer and an interlayer insulating layer in a semiconductor device.

The following examples illustrate the present invention in more detail. However, it is understood that the present invention is not limited by these examples.

SYNTHESIS EXAMPLE 1

Polyamic Acid Ester Compound (PAE-1) Synthesis 18.0 g of 1,3,3a,4,5,9b-hexahydro-5-(tetrahydro-2,5-dioxofuran-3-yl)naphto[1,2-c]furan-1,3-dione is added into a four-necked flask mounted with an agitator, a temperature controlling device, a nitrogen gas injector, and a condenser while nitrogen is flowing, and 132 g of N-methyl-2-pyrrolidone (NMP) is introduced therein and dissolved. The solid amount is 20 wt % in the obtained solution.

When the solid is completely dissolved, 9.9 g of pyridine is introduced into the solution, and 5.7 g of ethyl alcohol is slowly dripped into the solution for 30 minutes while the temperature is maintained between 0 and 5° C. After adding the ethyl alcohol, the solution is reacted at a temperature of 25° C. for 12 hours to provide an ethyl ester solution of tetracarboxylic acid dianhydride. 14.9 g of thionyl chloride is slowly dripped for 30 minutes while the temperature is maintained between 0 and 5° C. The solution is agitated after the dripping process while the temperature is maintained for 30 minutes, then the temperature of the solution is increased to 25° C. and further agitated for one and half hour to provide a diethyl ester dichloride solution of tetra carboxylic acid dianhydride. A solution in which 22.0 g of 2,2-bis(3-amino-4-hydroxyphenyl)-1,1,1,3,3,3-hexafluoro propane and 19 g of pyridine are dissolved in 168 g of NMP is slowly dripped for 30 minutes while the temperature of solution is maintained at 0 to 5° C. The temperature is increased to 40° C. after the dripping, and the reaction is completed while agitating at this temperature for 2 hours. The reaction mixture is introduced into a solution of water/methanol=10/1 (volume ratio) to produce a precipitate. Then the precipitate is sufficiently filtered, washed, and dried at 80° C. under vacuum for 24 hours to synthesize a polyamic acid ester compound (PAE-1) represented by Compound Formula 22 having an average molecular weight (Mw) of 13,900 and polydispersity (PD) of 1.8.

[Chemical Formula 22]

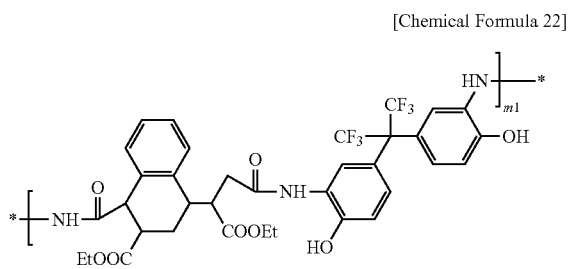

SYNTHESIS EXAMPLE 2

Synthesizing Polyamic Acid Ester Compound (PAE-2)

A polyamic acid ester compound (PAE-2) represented by Compound Formula 23 having an average molecular weight of 12,300 and polydispersity of 1.6 is synthesized in accordance with the same procedure as in Synthesis Example 1, except that 22.0 g of 2,2-bis(3-amino-4-hydroxyphenyl)-1,1,1,3,3,3-hexafluoropropane is substituted with 15.16 g of 2,2-bis(3-amino-4-hydroxyphenyl)-1,1,1,3,3,3-hexafluoropropane and 3.68 g of 4,4-diamino phenyl methane. $m_1$ is 70 mol %, and $m_2$ is 30 mol % in Chemical Formula 23.

SYNTHESIS EXAMPLE 3

Synthesizing Polyamic Acid Ester Compound (PAE-3)

A polyamic acid ester compound (PAE-3) represented by Compound Formula 23 having an average molecular weight of 11,500 and polydispersity of 1.7 is synthesized in accordance with the same procedure as in Synthesis Example 1, except that 22.0 g of 2,2-bis(3-amino-4-hydroxyphenyl)-1,1,1,3,3,3-hexafluoropropane is substituted with 17.58 g of 2,2-bis(3-amino-4-hydroxyphenyl)-1,1,1,3,3,3-hexafluoropropane and 2.38 g of 4,4-diamino phenyl methane. In Chemical Formula 23, $m_1$ is 80 mol % and $m_2$ is 20 mol %.

SYNTHESIS EXAMPLE 4

Synthesizing Polyamic Acid Ester Compound (PAE-4)

A polyamic acid ester compound (PAE-4) having an average molecular weight of 13,700 and polydispersity of 1.7 is synthesized in accordance with the same procedure as in Synthesis Example 1, except that 22.0 g of 2,2-bis(3-amino-4-hydroxyphenyl)-1,1,1,3,3,3-hexafluoropropane is substituted with 20.88 g of 2,2-bis(3-amino-4-hydroxyphenyl)-1,1,1,3,3,3-hexafluoropropane and 1.03 g of 1,3-bis(aminopropyl)tetramethyldisiloxane.

SYNTHESIS EXAMPLE 5

Synthesizing Polyamic Acid Ester Compound (PAE-5)

A polyamic acid ester compound (PAE-5) represented by the following Formula 24 having an average molecular weight of 14,100 and polydispersity of 1.9 is synthesized in accordance with the same procedure as in Synthesis Example 1, except that 7.42 g of isopropyl alcohol is used instead of ethyl alcohol.

[Chemical Formula 24]

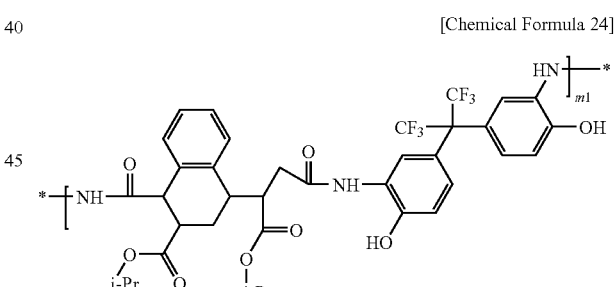

[Chemical Formula 23]

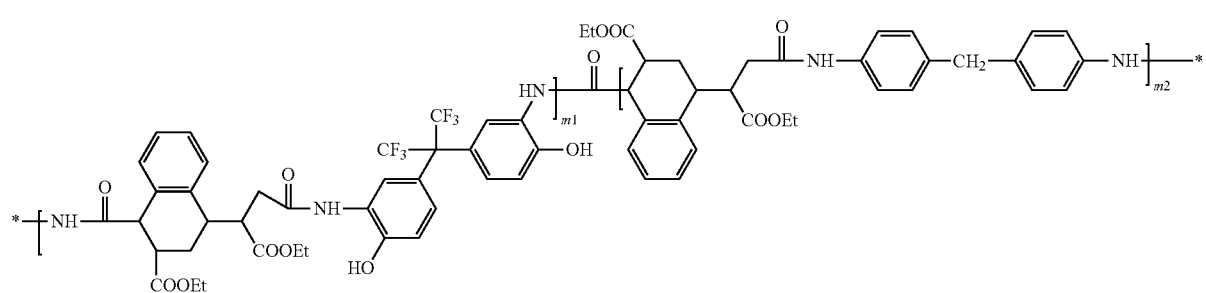

COMPARATIVE SYNTHESIS EXAMPLE 1

Synthesizing Polyamic Acid Ester Compound (PAE-6)

A polyamic acid ester compound (PAE-6) represented by the following Chemical Formula 25 having an average molecular weight of 14,000 and polydispersity of 1.6 is synthesized in accordance with the same procedure as in Synthesis Example 1, except that 18.0 g of 1,3,3a,4,5,9b-hexahydro-5-(tetrahydro-2,5-dioxofuran-3-yl)naphto[1,2-c]furan-1,3-dione is substituted with 19.32 g of 3,3',4,4'-benzophenone tetracarboxylic acid dianhydride.

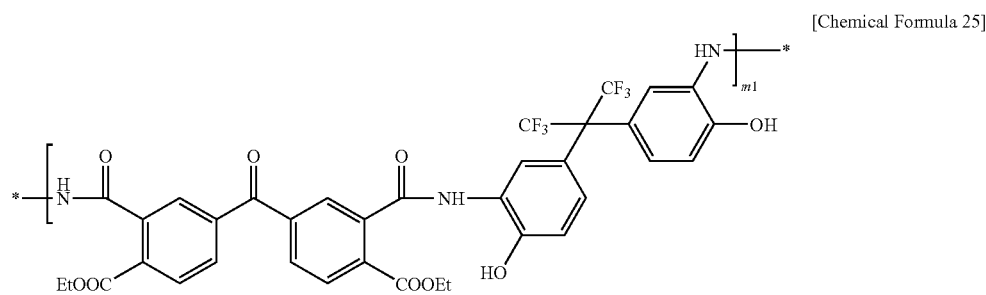

[Chemical Formula 25]

COMPARATIVE SYNTHESIS EXAMPLE 2

Synthesizing Polyamic Acid Ester Compound (PAE-7)

A polyamic acid ester compound (PAE-7) represented by the following Formula 26 having an average molecular weight of 13,300 and polydispersity of 1.7 is synthesized in accordance with the same procedure as in Synthesis Example 1, except that 18.0 g of 1,3,3a,4,5,9b-hexahydro-5-(tetrahydro-2,5-dioxofuran-3-yl)naphto[1,2-c]furan-1,3-dione is substituted with 17.64 g of 3,4:3',4'-biphenyl tetracarboxylic acid dianhydride.

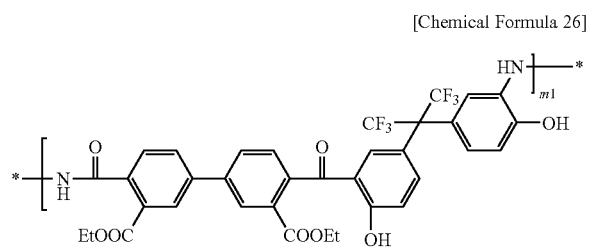

[Chemical Formula 26]

COMPARATIVE SYNTHESIS EXAMPLE 3

Synthesizing Polybenzo-Oxazole Precursor (PBO-1)

18.3 g of 2,2-bis(3-amino-4-hydroxyphenyl)-1,1,1,3,3,3-hexafluoro propane is added to a four-necked flask mounted with an agitator, a temperature controller, a nitrogen gas injector, and a condenser while nitrogen is flowing, and 280 g of N-methyl-2-pyrrolidone (NMP) is introduced therein and dissolved. The solid amount is 9 wt % in the obtained solution.

When the solid is completely dissolved, 9.9 g of pyridine is introduced into the solution, and a solution in which 14.8 g of 4,4'-oxydibenzonyl chloride is dissolved in 142 g of N-methyl-2-pyrrolidone (NMP) is slowly dripped into the obtained solution for 30 minutes while the temperature is maintained between 0 and 5° C. After dripping, it is reacted at a temperature ranging from 0 to 5° C. for one hour and heated to a room temperature. It is agitated for one hour to complete the reaction. The reaction mixture is introduced into a solution of water/methanol=10/1 (volume ratio) to produce a precipitate. Then the precipitate is filtered, sufficiently washed, and dried at 80° C. under vacuum for 24 hours or more to synthesize a polybenzoxazole precursor (PBO-1) represented by Compound Formula 27 having an average molecular weight (Mw) of 10,900 and polydispersity of 1.7.

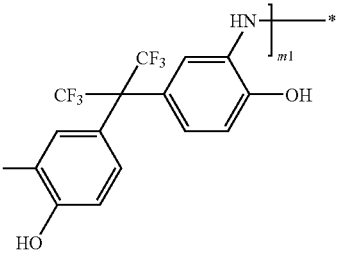

[Chemical Formula 27]

EXAMPLE 1

15 g of the polyamic acid ester compound (PAE-1) obtained from Synthesis Example 1 is added to and dissolved in 30 g of γ-butyrolactone (GBL), then 3 g of photosensitive diazoquinone represented by the following Chemical Formula 28, 0.75 g of trimethoxy[3-(phenylamino)propyl]silane represented by the following Chemical Formula 29, and 0.75 g of a phenol compound represented by the following Chemical Formula 30 are added to and dissolved therein, and filtered through 0.45 μm fluorine resin-made filter to provide a positive photosensitive polybenzoxazole precursor composition.

[Chemical Formula 28]

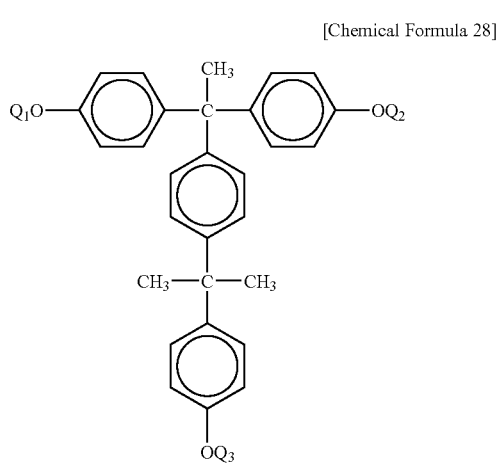

In the above formula, two of $Q_1$, $Q_2$, and $Q_3$ are substituted with the following Chemical Formula 28-1, and the remaining one is hydrogen.

[Chemical Formula 28-1]

[Chemical Formula 29]

[Chemical Formula 30]

EXAMPLE 2

A positive photosensitive polybenzoxazole precursor composition is prepared in accordance with the same procedure as in Example 1, except that 15 g of the polyamic acid ester compound (PAE-1) according to Synthesis Example 1 is substituted with 15 g of the polyamic acid ester compound (PAE-2) according to Synthesis Example 2.

EXAMPLE 3

A positive photosensitive polybenzoxazole precursor composition is prepared in accordance with the same procedure as in Example 1, except that 15 g of the polyamic acid ester compound (PAE-1) according to Synthesis Example 1 is substituted with 15 g of the polyamic acid ester compound (PAE-3) according to Synthesis Example 3.

EXAMPLE 4

A positive photosensitive polybenzoxazole precursor composition is prepared in accordance with the same procedure as in Example 1, except that 15 g of the polyamic acid ester compound (PAE-1) according to Synthesis Example 1 is substituted with 15 g of the polyamic acid ester compound (PAE-4) according to Synthesis Example 4.

EXAMPLE 5

A positive photosensitive polybenzoxazole precursor composition is prepared in accordance with the same procedure as in Example 1, except that 15 g of the polyamic acid ester compound (PAE-1) according to Synthesis Example 1 is substituted with 15 g of the polyamic acid ester compound (PAE-5) according to Synthesis Example 5.

COMPARATIVE EXAMPLE 1

A positive photosensitive polybenzoxazole precursor composition is prepared in accordance with the same procedure as in Example 1, except that 15 g of the polyamic acid ester compound (PAE-1) according to Synthesis Example 1 is substituted with 15 g of the polyamic acid ester compound (PAE-6) according to Comparative Synthesis Example 1.

COMPARATIVE EXAMPLE 2

A positive photosensitive polybenzoxazole precursor composition is prepared in accordance with the same procedure as in Example 1, except that 15 g of the polyamic acid ester compound (PAE-1) according to Synthesis Example 1 is substituted with 15 g of the polyamic acid ester compound (PAE-7) according to Comparative Synthesis Example 2.

COMPARATIVE EXAMPLE 3

A positive photosensitive polybenzoxazole precursor composition is prepared in accordance with the same procedure as in Example 1, except that 15 g of the polyamic acid ester compound (PAE-1) according to Synthesis Example 1 is substituted with 15 g of the polybenzoxazole precursor (PBO-1) according to Comparative Synthesis Example 3.

Measuring Physical Properties

Each of the photosensitive polybenzoxazole precursor compositions prepared from Examples 1 to 5 and Comparative Examples 1 to 3 is coated on an 8-inch wafer by a spin coater manufactured by Mikasa (1H-DX2), then it is heated on a hot plate to 120° C. for 4 minutes to provide a photosensitive polyimide precursor film.

The polyimide precursor film is exposed through a mask having various patterns by an I-line stepper (NSR i10C) manufactured by Nikon Japan for 250 ms, dissolved in a 2.38% tetramethyl ammonium hydroxide aqueous solution at room temperature for 60 seconds (2 puddles) to remove the exposed part, and washed with pure water for 30 seconds.

The resolution of the obtained film pattern is observed through an optical microscope, and the film thickness is measured by equipment manufactured by ST4000-DLX (K-MAC, Korea Materials & Analysis Corp). The results are shown in the following Table 1.

With regard to the decrease of the film thickness affected by the development, and the resulting film thickness, it is preferable that loss of film thickness is reduced during the development. In order to measure this, the pre-baked film is immersed in 2.38% tetramethyl ammonium hydroxide (TMAH) aqueous solution for different times and washed with water, so the change of film thickness is measured to calculate the residual film ratio (thickness after development/thickness before development, unit: %). The results are shown in the following Table 1.

The sensitivity and resolution are measured, and the results are shown in Table 1.

In order to measure the sensitivity, the optimal exposure time is determined when a 10 μm L/S (line and space) pattern is formed in a line width of 1 to 1, and the resolution is determined as the minimum pattern size at the optimal exposure time.

TABLE 1

| | | Film thickness (μm) | | Residual film ratio (%) | Sensitivity (mJ/cm$^2$) | Resolution (μm) |
|---|---|---|---|---|---|---|
| | Resin | Prebaking | After development | | | |
| Example 1 | PAE-1 | 8.3 | 7.5 | 90.3 | 400 | 5 |
| Example 2 | PAE-2 | 8.3 | 8.1 | 97.6 | 750 | 5 |
| Example 3 | PAE-3 | 8.2 | 7.5 | 91.5 | 470 | 3 |
| Example 4 | PAE-4 | 8.1 | 7.3 | 90.1 | 450 | 7 |
| Example 5 | PAE-5 | 8.3 | 7.5 | 90.4 | 440 | 3 |
| Comparative Example 1 | PAE-6 | 8.3 | 7.1 | 85.5 | 900 | 5 |
| Comparative Example 2 | PAE-7 | 8.3 | 7.5 | 90.3 | 510 | 5 |
| Comparative Example 3 | PBO-1 | 8.3 | 7.6 | 91.6 | 480 | 3 |

In addition, the obtained patterns are cured in an electronic furnace under an oxygen concentration of 1000 ppm or below at 120° C. for 30 minutes and at a high temperature of 200° C. or above for 30 minutes to provide a patterned films.

The change of film thickness after curing is measured by equipment manufactured by ST4000-DLX (K-MAC, Korea Materials & Analysis Corp) as above.

The adherence to the substrate is determined by measuring the degree of separation from the substrate after heating the cured film at 121° C. under an atmospheric pressure of 2 for a certain time in accordance with a cross-cut method in JISK-5400, and by measuring the time that the separation began.

The ring closure ratio stands for the degree in percent that polyamic acid is closed and transformed to "polyimide" or polyamic acid ester is closed and transformed to "polybenzoxazole." In order to measure the ring closure ratio, the cured film is peeled off and dissolved in a DMSO-d6 solvent to observe $^1$H NMR and compared to $^1$H NMR of a precursor that is not cured, and it is compared to the integration value of —NH and —OH peaks shown at 9.5 to 11.0 ppm.

The shrinkage ratio stands for the percentage of the differentiation between the film thickness before the baking and the film thickness after the baking. The film thickness is measured by equipment manufactured by ST4000-DLX (K-MAC, Korea Materials & Analysis Corp).

The results of measured ring closure ratio, film thickness, shrinkage ratio, and adherence are shown in the following Table 2.

TABLE 2

| | | Ring closure ratio (%) | | Film thickness after baking (μm) | Shrinkage ratio (%) | Adherence (separation time from the substrate (h)) |
|---|---|---|---|---|---|---|
| | Resin | 220° C. | 250° C. | | | |
| Example 1 | PAE-1 | 84 | 96 | 6.38 | 15.0 | >100 |
| Example 2 | PAE-2 | 61 | 69 | 7.27 | 10.3 | >100 |
| Example 3 | PAE-3 | 74 | 80 | 6.59 | 12.1 | >100 |

TABLE 2-continued

| | Resin | Ring closure ratio (%) 220° C. | Ring closure ratio (%) 250° C. | Film thickness after baking (μm) | Shrinkage ratio (%) | Adherence (separation time from the substrate (h)) |
|---|---|---|---|---|---|---|
| Example 4 | PAE-4 | 81 | 94 | 6.25 | 14.8 | >100 |
| Example 5 | PAE-5 | 83 | 92 | 6.41 | 14.5 | >100 |
| Comparative Example 1 | PAE-6 | 0 | 24 | 5.89 | 17.1 | >100* |
| Comparative Example 2 | PAE-7 | 15 | 36 | 6.29 | 16.1 | >100* |
| Comparative Example 3 | PBO-1 | 0 | 23 | 5.84 | 23.1 | 24* |

In Table 2, * means that the results are obtained after curing at 320° C./30 minutes in order to completely cure the obtained pattern.

As shown in Table 1, the photosensitive resin compositions according to Examples 1 to 5 have similar optical characteristics such as sensitivity, residual film ratio, and resolution to those of photosensitive resin compositions according to Comparative Examples 1 to 3. However, in Table 2, the data demonstrates that Examples 1 to 5 have high ring closure ratios when subjected to a curing process at a low temperature of 260° C., while Comparative Examples 1 to 3 have very low ring closure ratios. In other words, the photosensitive resin compositions according to Examples 1 to 5 could have comparative or superior photosensitivity to those of the photosensitive resin compositions according to Comparative Examples 1 to 3, and it is possible for them to be adapted to a surface protective layer and an interlayer insulating layer by curing the pattern at a lower temperature. In addition, since the compositions have higher adherence to the substrate than the cured film of polybenzoxazole according to Comparative Example 3, they can provide a more stable surface protective layer and interlayer insulating layer.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

The invention claimed is:

1. A positive photosensitive resin composition, comprising:
(A) a polyamic acid or polyamic acid ester compound including a repeating unit represented by the following Formula 1;
(B) a photosensitive diazoquinone compound;
(C) a silane compound;
(D) a phenol compound; and
(E) a solvent,

[Chemical Formula 1]

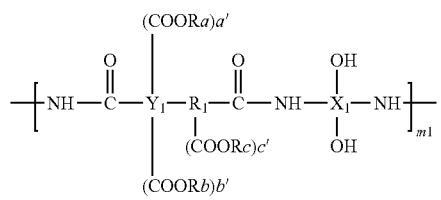

-continued

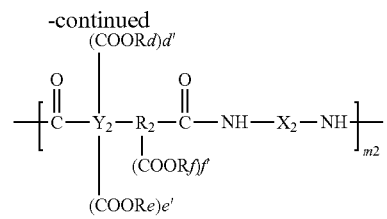

wherein in the above Formula 1,
Ra, Rb, Rc, Rd, Re, and Rf are the same or different and are independently hydrogen or a monovalent organic group,
$R_1$ and $R_2$ are the same or different and are independently a single bond or substituted or unsubstituted alkylene,
a', b', c', d', e', and f' are the same or different and are independently 0 or 1, a'+b'+c' and d'+e'+f' are integers of 2 or 3, respectively,
$Y_1$ and $Y_2$ are the same or different and are independently a substituted or unsubstituted alicyclic organic group, derived from one of the compounds represented by the following Chemical Formulae 6 or 8:

[Chemical Formula 6]

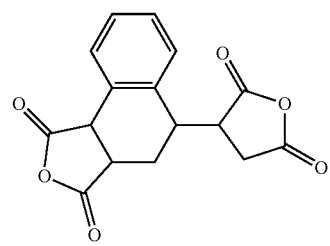

[Chemical Formula 8]

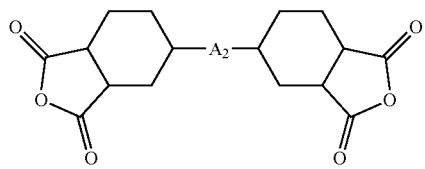

wherein in the above Formula 8,
$A_2$ is O, $CR_{14}R_{15}$, CO, CONH, S, or $SO_2$, wherein $R_{14}$ and $R_{15}$ are the same or different and are independently substituted or unsubstituted alkyl, hydrogen, or fluoroalkyl,
$X_1$ is substituted or unsubstituted arylene, substituted or unsubstituted alkylene, or substituted or unsubstituted cycloalkylene, $X_2$ is a divalent to a quadrivalent aromatic or aliphatic organic group, or is a functional group represented by the following Formula 2, m1 and m2 are mole ratios, m1+m2=100 mol %, m1 ranges from 60 to 100 mol %, and m2 ranges from 0 to 40 mol %:

[Chemical Formula 2]

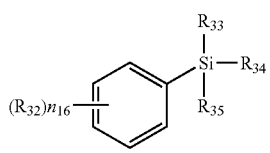

wherein in the above Formula 2, $R_3$, $R_4$, $R'_3$ and $R'_4$ are the same or different and are independently substituted or unsubstituted alkyl, substituted or unsubstituted aryl, substituted or unsubstituted alkoxy, or hydroxy, $R_5$ and $R_6$ are the same or different and are independently substituted or unsubstituted alkylene or substituted or unsubstituted arylene, and k is an integer ranging from 1 to 50.

2. The positive photosensitive resin composition of claim 1, wherein $R_1$ and $R_2$ are the same or different and are independently a C1 to C5 alkylene.

3. The positive photosensitive resin composition of claim 1, wherein the polyamic acid or polyamic acid ester compound has a weight average molecular weight (Mw) of 3000 to 300,000.

4. The positive photosensitive resin composition of claim 1, wherein the silane compound includes a compound represented by the following Formulae 14 or 15:

[Chemical Formula 14]

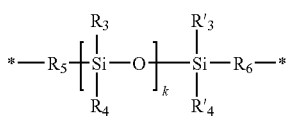

wherein in the above Formula 14, $R_{32}$ is $NH_2$ or $CH_3CONH$, $R_{33}$ to $R_{35}$ are the same or different and are independently substituted or unsubstituted alkoxy, and n16 is an integer ranging from 1 to 5; and

[Chemical Formula 15]

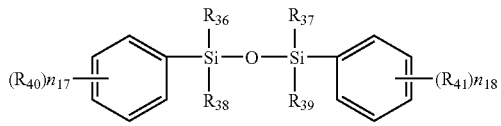

wherein in the above Formula 15, $R_{36}$ to $R_{39}$ are the same or different and are independently substituted or unsubstituted alkoxy, $R_{40}$ and $R_{41}$ are the same or different and are independently substituted or unsubstituted amino, and n17 and n18 are the same or different and are independently integers ranging from 1 to 5.

5. The positive photosensitive resin composition of claim 4, wherein $R_{33}$ to $R_{35}$ are the same or different and are independently $OCH_3$ or $OCH_2CH_3$.

6. The positive photosensitive resin composition of claim 1, wherein the solvent comprises N-methyl-2-pyrrolidone, γ-butyrolactone, N,N-dimethyl acetamide, dimethylsulfoxide, diethyleneglycol dimethylether, diethyleneglycol diethylether, diethyleneglycol dibutylether, propyleneglycol monomethylether, dipropyleneglycol monomethylether, propyleneglycol monomethylether acetate, methyl lactate, ethyl lactate, butyl lactate, methyl-1,3-butyleneglycol acetate, 1,3-butyleneglycol-3-monomethylether, methyl pyruvate, ethyl pyruvate, methyl-3-methoxy propionate, or a combination thereof.

7. The positive photosensitive resin composition of claim 1, wherein the resin composition comprises 5 to 100 parts by weight of the (B) photosensitive diazoquinone compound, 0.1 to 30 parts by weight of the (C) silane compound, 1 to 30 parts by weight of the (D) phenol compound, and 50 to 200 parts by weight of the (E) solvent, based on 100 parts by weight of the (A) polyamic acid or polyamic acid ester compound.

8. The positive photosensitive resin composition of claim 1, wherein the polyamic acid or polyamic acid ester compound includes one of compounds represented by the following Formulae 22 to 24:

[Chemical Formula 22]

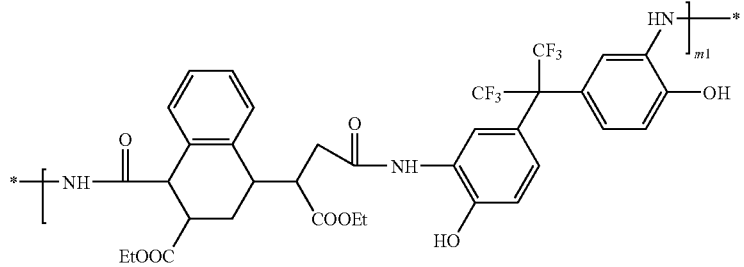

[Chemical Formula 23]

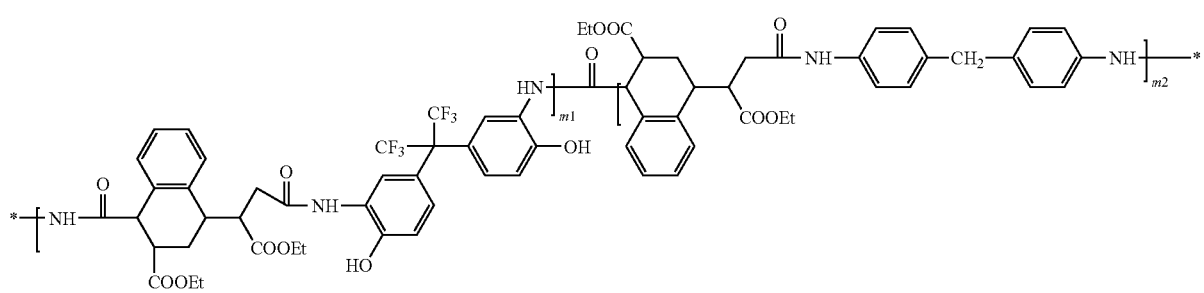

-continued
[Chemical Formula 24]
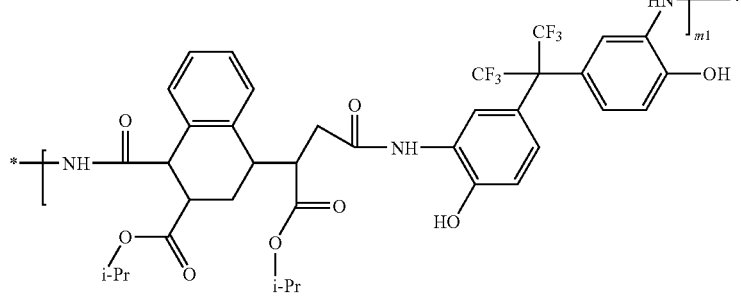
wherein in the above Formulae 22 to 24, m1 and m2 are each mole ratios, m1+m2=100 mol %, m1 ranges from 60 to 100 mol %, and m2 ranges from 0 to 40 mol %.
9. A photosensitive resin film fabricated using the positive photosensitive resin composition according to claim 1.
10. A semiconductor electronic component comprising the photosensitive resin film according to claim 9.
* * * * *

UNITED STATES PATENT AND TRADEMARK OFFICE
CERTIFICATE OF CORRECTION

PATENT NO.        : 8,568,954 B2
APPLICATION NO.   : 12/884316
DATED             : October 29, 2013
INVENTOR(S)       : Doo-Young Jung et al.

Page 1 of 1

It is certified that error appears in the above-identified patent and that said Letters Patent is hereby corrected as shown below:

In the Specification:

Column 6, Line 49 reads: "yphenyl)methane,    2,2 bis(3-2,2-bis(3-amino-4-"
and should read: "yphenyl)methane, 2,2-bis(3-amino-4-hydroxyphenyl)propane, 2,2-bis(3-amino-4-"

Column 10, Line 23 reads: "methoxysilane,    p-styryl    3-methacryloxypropylmeth-"
and should read: "methoxysilane, p-styryl trimethoxysilane, 3-methacryloxypropylmeth-"

Signed and Sealed this
Thirty-first Day of December, 2013

Margaret A. Focarino
*Commissioner for Patents of the United States Patent and Trademark Office*